(12) United States Patent
Gozali et al.

(10) Patent No.: US 8,570,072 B2
(45) Date of Patent: *Oct. 29, 2013

(54) DIFFERENTIAL HYSTERESIS COMPARATOR CIRCUITS AND METHODS

(75) Inventors: David Gozali, Singapore (SG); Hong Liang Zhang, Singapore (SG)

(73) Assignee: Marvell International Ltd., Hamilton (BM)

( * ) Notice: Subject to any disclaimer, the term of this patent is extended or adjusted under 35 U.S.C. 154(b) by 59 days.

This patent is subject to a terminal disclaimer.

(21) Appl. No.: 12/917,802

(22) Filed: Nov. 2, 2010

(65) Prior Publication Data

US 2011/0102021 A1   May 5, 2011

Related U.S. Application Data

(63) Continuation of application No. 12/391,200, filed on Feb. 23, 2009, now Pat. No. 7,843,230.

(60) Provisional application No. 61/033,125, filed on Mar. 3, 2009.

(51) Int. Cl.
*H03K 5/22* (2006.01)

(52) U.S. Cl.
USPC .............................. 327/63; 327/65; 327/205

(58) Field of Classification Search
USPC .............. 327/63, 65, 66, 68, 69, 74, 205, 206
See application file for complete search history.

(56) References Cited

U.S. PATENT DOCUMENTS

| 6,535,031 B1* | 3/2003 | Nguyen et al. | 327/65 |
| 7,692,453 B2* | 4/2010 | Ajram et al. | 327/65 |
| 7,843,230 B1* | 11/2010 | Gozali et al. | 327/63 |

* cited by examiner

*Primary Examiner* — Long Nguyen

(57) ABSTRACT

A comparator circuit for providing hysteresis comprises first and second differentially coupled transistors. The first of the differentially coupled transistors provides drain current to first and second load transistors. The second of the differentially coupled transistors provides drain current to third and fourth load transistors. In one example embodiment, the drain of the first of the differentially coupled transistors also drives the gate of the first and third load transistors, while the drain of the second of the differentially coupled transistors drives the gate of the second and fourth transistors.

20 Claims, 5 Drawing Sheets

US 8,570,072 B2

DIFFERENTIAL HYSTERESIS COMPARATOR CIRCUITS AND METHODS

CROSS REFERENCE TO RELATED APPLICATIONS

This is a continuation of and claims the benefit of U.S. patent application Ser. No. 12/391,200, filed Feb. 23, 2009, now U.S. Pat. No. 7,843,230, entitled "Differential Hysteresis Comparator Circuits and Methods," naming David Gozali and Hong Liang Zhang as inventors, the content of which is hereby incorporated herein by reference in its entirety, and which claimed the benefit of commonly-assigned U.S. Provisional Patent Application No. 61/033,125, filed Mar. 3, 2008.

BACKGROUND

This invention relates generally to electrical circuits, and more particularly to comparators.

FIG. 1 illustrates a prior art comparator 1 for comparing an input voltage Vin with a reference voltage Vref and generating an output voltage Vout therefrom. Voltage Vin is applied to a voltage divider 2 comprising resistors R1, R2 and R3. Voltage divider 2 is coupled to provide a voltage VDIV to the gate of a transistor T1 via one of two switches SW1, SW2. When voltage VDIV exceeds reference voltage Vref, transistor T2 passes more current than transistor T1, the voltage at node 5 exceeds the voltage at node 4, and output voltage Vout is high. When voltage Vref exceeds voltage VDIV, transistor T1 passes more current than transistor T2, the voltage at node 4 exceeds the voltage at node 5, and voltage Vout is low.

As mentioned above, voltage VDIV is established by series-coupled resistors R1, R2 and R3 and switches SW1, SW2. Switches SW1 and SW2 are controlled to vary voltage VDIV such that comparator 1 exhibits hysteresis.

SUMMARY

In one embodiment, the present invention includes a comparator circuit comprising first and second transistors coupled as a differential pair. A control terminal of the first transistor is coupled to receive a first input voltage, and a control terminal of the second transistor coupled to receive a second input voltage. The differential pair is coupled to pass a first current through a first terminal of the differential pair and a second current through a second terminal of the differential pair. The first and second currents are responsive to a comparison of the first and second input voltages. The circuit further includes a third transistor coupled to pass a first portion of the first current in response to the voltage at the first terminal of the differential pair and a fourth transistor coupled to pass a first portion of the second current in response to the voltage at the first terminal of the differential pair. The current flowing through the third and fourth transistors cause the comparator circuit to exhibit hysteresis.

In one embodiment, the comparator circuit further comprises a fifth transistor passing a second portion of the first current in response to the voltage at the second terminal, and a sixth transistor passing a second portion of the second current in response to the voltage at the second terminal.

In one embodiment, a control terminal of the third transistor is coupled to a control terminal of the fourth transistor, and wherein a control terminal of the fifth transistor is coupled to a control terminal of the sixth transistor.

In one embodiment, the control terminals of the third and fourth transistors are coupled to a first output terminal of the comparator and the control terminals of the fifth and sixth transistors are coupled to a second output terminal of the comparator.

In one embodiment, the control terminals of the third and fourth transistors are coupled to at least one output terminal of the comparator through one or more current mirrors and the control terminals of the fifth and sixth transistors are coupled to at least one output terminal of the comparator through one or more current mirrors.

In one embodiment, the comparator circuit further comprises a second differential pair including a first control terminal to receive a third input voltage and a second control terminal to receive a fourth input voltage, the differential pair coupled to pass a third current through a first terminal of the second differential pair and a fourth current through a second terminal of the second differential pair, the third and fourth currents being responsive to a comparison of the third and fourth input voltages, a seventh transistor having a drain and a gate coupled to the first terminal of the second differential pair, an eighth transistor having a gate coupled to the first terminal of the second differential pair and drain coupled to the second terminal of the second differential pair, a ninth transistor having a drain and a gate coupled to the second terminal of the second differential pair, a tenth transistor having a gate coupled to the second terminal of the second differential pair and drain coupled to the first terminal of the second differential pair, wherein current through the third and fourth transistors is mirrored to a first output terminal and current through the seventh and eighth transistors is mirrored to the first output terminal, and wherein current through the fifth and sixth transistors is mirrored to a second output terminal and current through the ninth and tenth transistors is mirrored to the second output terminal.

In one embodiment, the comparator circuit further comprises a second differential pair including a first control terminal to receive a third input voltage and a second control terminal to receive a fourth input voltage, the second differential pair coupled to pass a third current through a first terminal of the second differential pair and a fourth current through a second terminal of the second differential pair, the third and fourth currents being responsive to a comparison of the third and fourth input voltages, wherein the third transistor has a gate and a drain coupled to the first terminal of the second differential pair and the fourth transistor has a gate coupled to the first terminal of the second differential pair and a drain coupled to the second terminal of the second differential pair, and wherein the sixth transistor has a gate and a drain coupled to the second terminal of the second differential pair and the fifth transistor has a gate coupled to the second terminal of the second differential pair and a drain coupled to the first terminal of the second differential pair.

In one embodiment, the third and fourth transistor each have a gate length and a gate width, and wherein the hysteresis exhibited by the comparator is based on the ratio of the gate width to gate length of the third transistor to the gate width to gate length of the fourth transistor.

In one embodiment, the comparator circuit further comprises a current source providing a current into a node, the node being coupled to a second terminal of the first transistor and a second terminal of the second transistor.

In another embodiment, the present invention includes a system comprising a comparator circuit, the comparator circuit comprising first and second transistors coupled as a differential pair, a control terminal of the first transistor coupled to receive a first input voltage, a control terminal of the second transistor coupled to receive a second input voltage, the differential pair coupled to pass a first current through a first terminal of the differential pair and a second current through a second terminal of the differential pair, the first and second currents being responsive to a comparison of the first and second input voltages, a third transistor coupled to pass a first portion of the first current in response to the voltage at the first terminal, a fourth transistor coupled to pass a first portion of the second current in response to the voltage at the first terminal, wherein the current flowing through the third and fourth transistors cause the comparator circuit to exhibit hysteresis.

In one embodiment, the system comprises an integrated circuit.

In another embodiment, the present invention includes a method for comparing two input voltages comprising receiving a first input voltage at a first control terminal of a differential circuit and a second input voltage at a second control terminal of the differential circuit, generating first current at a first terminal of the differential circuit and a second current at a second terminal of the differential circuit, the first and second currents being responsive to a comparison of the first and second input voltages, passing a first portion of the first current through a terminal of a first transistor in response to a voltage at the first terminal of the differential circuit, and passing a first portion of the second current through a terminal of a second transistor in response to the voltage at the first terminal of the differential circuit, wherein the current flowing through the third and fourth transistors cause the comparator circuit to exhibit hysteresis.

In one embodiment, the first transistor has a gate and a drain coupled to the first terminal of the differential circuit and the second transistor has a gate coupled to the first terminal of the differential circuit and a drain coupled to the second terminal of the differential circuit.

In one embodiment, the method further comprises passing a second portion of the first current through a terminal of a third transistor in response to the voltage at the second terminal of the differential circuit, and passing a second portion of the second current through a terminal of a fourth transistor in response to the voltage at the second terminal of the differential circuit.

In one embodiment, the fourth transistor has a gate and a drain coupled to the second terminal of the differential circuit and the third transistor has a gate coupled to the second terminal of the differential circuit and a drain coupled to the first terminal of the differential circuit.

In one embodiment, the method further comprises mirroring current through the first transistor to at least one output terminal and mirroring current through the fourth transistor to at least one output terminal.

The third, fourth, fifth and sixth transistors are typically MOS transistors having channels characterized by a width and a length. The amount of hysteresis exhibited by the comparator is established as a function of the ratio of $(W/L)_4$ to $(W/L)_5$, and the ratio of $(W/L)_3$ to $(W/L)_6$, where $(W/L)_3$, $(W/L)_4$, $(W/L)_5$ and $(W/L)_6$ are the widths divided by lengths of the third, fourth, fifth and sixth transistors, respectively.

Additional embodiments will be evident from the following detailed description and accompanying drawings, which provide a better understanding of the nature and advantages of the present invention.

DETAILED DESCRIPTION

Figure 1:
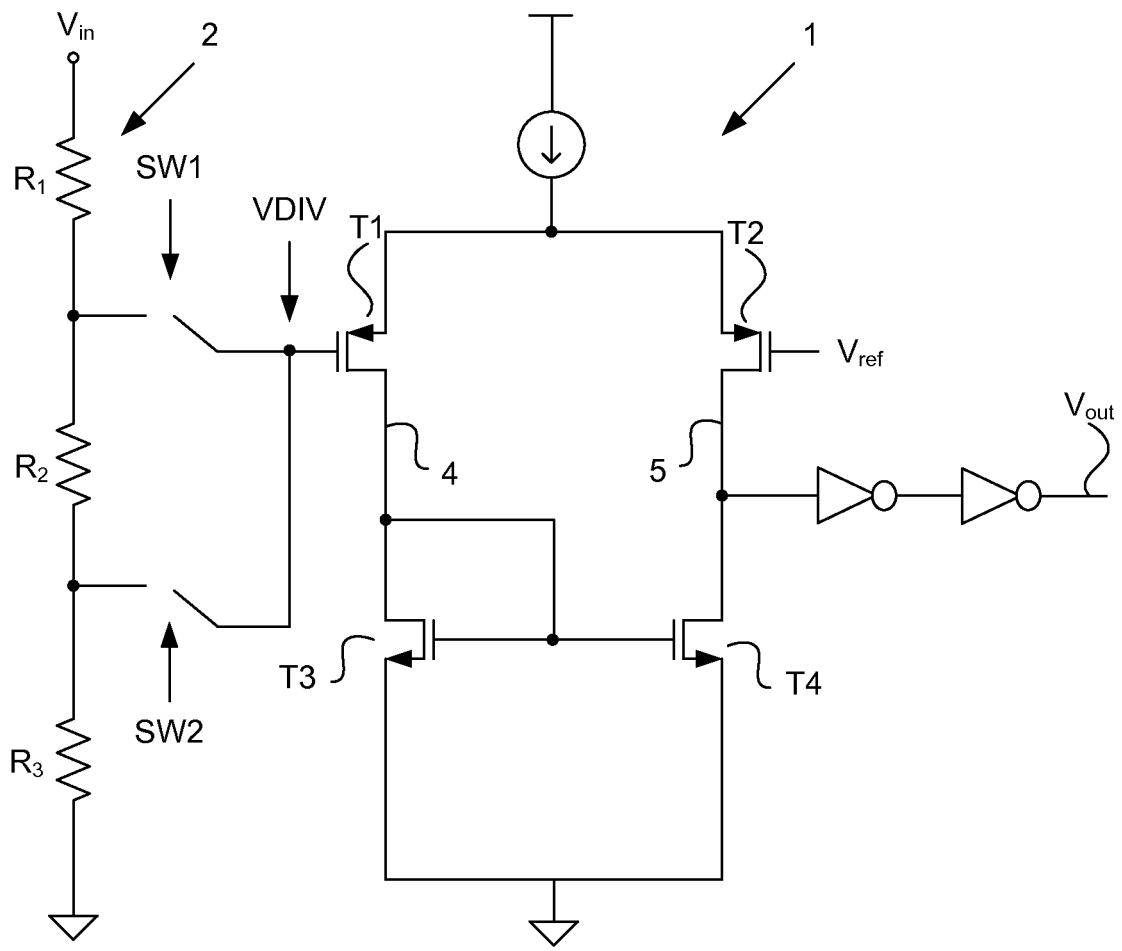
FIG. 1 schematically illustrates a prior art comparator that exhibits hysteresis.
Figure 2:
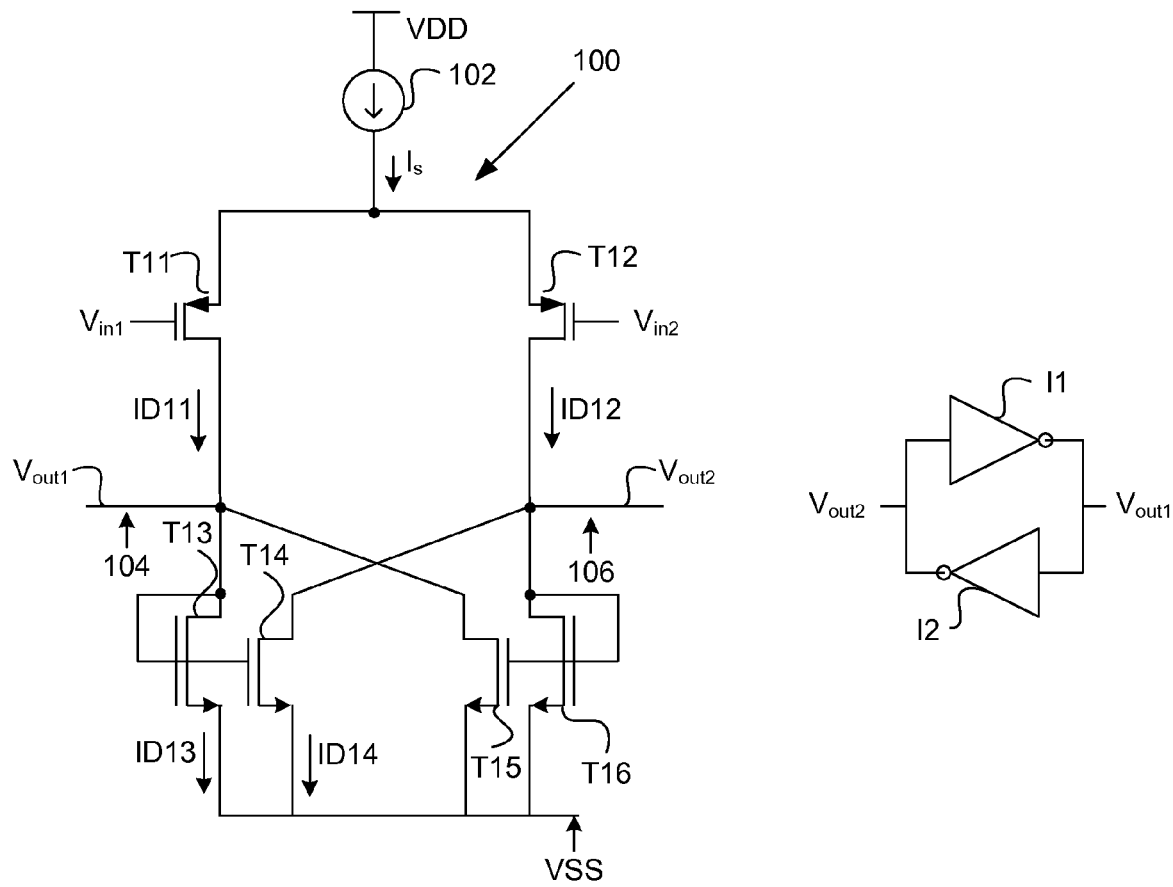
FIG. 2 schematically illustrates one implementation of a comparator.

FIG. 2 illustrates a comparator 100 constructed in accordance with one implementation of the invention. Comparator 100 comprises transistors T11 and T12 coupled to respectively receive differential input voltages Vin1 and Vin2. Either or both of voltages Vin1 and Vin2 can be signals or reference voltages. The drains of transistors T11 and T12 are coupled to a current source 102 which passes a current IS. Current source 102 is coupled to receive a DC voltage VDD. In one exemplary implementation, VDD is about 3 V.

The drain of transistor T11 is coupled to the gates of transistors T13 and T14 and the drains of transistor T13 and T15. Similarly, the drain of transistor T12 is coupled to the gates of transistors T15 and T16 and the drain of transistors T14 and T16. Comparator 100 provides output voltages Vout1 and Vout2 at output terminals 104 and 106 in response to input voltages Vin1 and Vin2. As explained below, transistors T14 and T15 cause comparator 100 to exhibit hysteresis. The amount of hysteresis depends upon the ratio of W14/L14 to W13/L13 and the ratio of W15/L15 to W16/L16, where W13 to W16 and L13 to L16 are the channel widths and lengths of transistors T13 to T16, respectively.

Also as explained in more detail below, if Vin1 is less than Vin2, transistor T11 passes more current than transistor T12, voltage Vout1 is greater than voltage Vout2, and transistors T13 and T14 are driven further into the on state than transistors T15 and T16. As voltage Vin1 rises above voltage Vin2 (or equivalently, as voltage Vin2 falls below voltage Vin1), the amount of current ID12 passing through transistor T12 increases. However, a portion of current ID12 is drawn through transistor T14, thereby preventing voltage Vout2 from quickly rising. Voltage Vout2 will not rise until current ID 12 is great enough to pull voltage Vout2 high despite current ID14 being drawn through transistor T14. In this way, comparator 100 exhibits hysteresis. The same phenomenon occurs when voltage Vin1 falls below voltage Vin2 (or equivalently, voltage Vin2 rises above voltage Vin1), and a portion of current ID11 passes through transistor T15, thereby causing comparator 100 to exhibit hysteresis.

Assume that current IA (the current flowing through transistor T11) comprises a superposition of DC and AC components. Accordingly, $$IA = (IS/2) + (gm11)(vgs11) \quad \text{(Equation 1)}$$

$$IA = (IS/2) + (gm11)(Vin12 - Vin11)/2 \quad \text{(Equation 2)}$$

where vgs11 is the AC component of the voltage across the gate and source of transistor T11 and gm11 is the gate-to-drain transfer conductance of transistor T11.

Also assume that Vout1>Vout2, T15 and T16 are off, and T13 and T14 are about to turn off. In other words, no current is flowing through T15 and T16. This means $$ID13 = (\beta13/2)(Vgs13 - Vthn)^2 \approx ID11 \quad \text{(Equation 3)}$$

$$ID14 = (\beta14/2)(Vgs14 - Vthn)^2 \approx ID12 \quad \text{(Equation 4)}$$

$$Vgs13 = Vgs14 \quad \text{(Equation 5)}$$

where ID13 is the drain current through transistor T13, β13 is the beta of transistor T13 (the beta of a transistor is proportional to the width divided by length of a transistor), Vgs13 is the voltage across the gate and source of transistor T13, Vthn is the threshold voltage of transistors T13-T16, ID14 is the drain current through transistor T14, β14 is the beta of transistor T14, and Vgs14 is the voltage across the gate and source of transistor T14.

It can be seen from the foregoing that $$\beta 13/\beta 14 \approx ID11/ID12. \qquad \text{(Equation 6)}$$

From equations 1-6, it can be concluded that $$Vin1-Vin2=(ID11/gm11)((\beta 13/\beta 14)-1) \qquad \text{(Equation 7)}$$

Similarly, if transistors T15 and T16 are about to turn off, and transistors T13 and T14 are already off, $$Vin2-Vin1=(ID12/gm12)((\beta 15/\beta 16)-1) \qquad \text{(Equation 8)}$$

where gm2 is the gate to drain transfer conductance of transistor T12, β15 is the beta of transistor T15 and β16 is the beta of transistor T16.

Since the beta of a transistor is proportional to the width of the transistor divided by the length of the transistor, it can be seen from equation 7 that the hysteresis can be adjusted by changing a) the ratio of (W14/L14) to (W15/L15) and b) the ratio of (W13/L13) to (W16/L16), where W13, W14, W15 and W16 are the widths of transistors T13, T14, T15 and T16, respectively, and L13, L14, L15 and L16 are the lengths of transistors T13, T14, T15 and T16, respectively.

In an alternative implementation, one can replace one MOS transistor with two MOS transistors connected in parallel between two nodes with a commonly connected control gate. Two such connected MOS transistors act as one transistor having a width equal to the sum of the widths of the parallel connected transistors.

In another implementation, back to back inverters I1 and I2 may be added across the outputs Vout1 and Vout2 to improve the gain. One inverter has an input terminal coupled to Vout1 and an output terminal coupled to Vout2. A second inverter has an input terminal coupled to Vout2 and an output terminal coupled to Vout1.

Hysteresis has several advantages. For example, if the two input signals Vin1 and Vin2 are very close, hysteresis helps prevent a) noise from causing a false output comparison signal; and b) the output signals from oscillating.

Figure 3A:
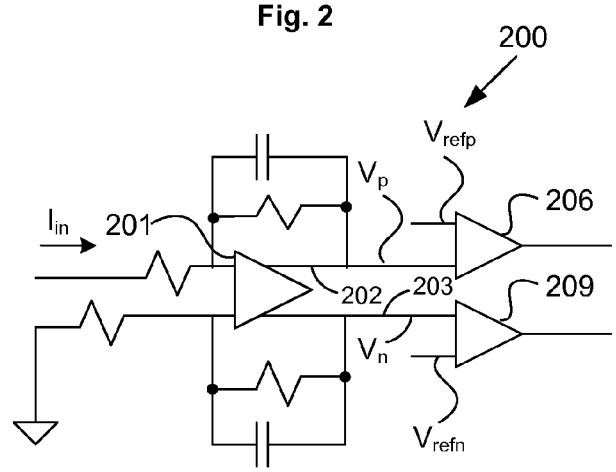
FIG. 3A schematically illustrates an over-current protection circuit including comparators.
Figure 3B:
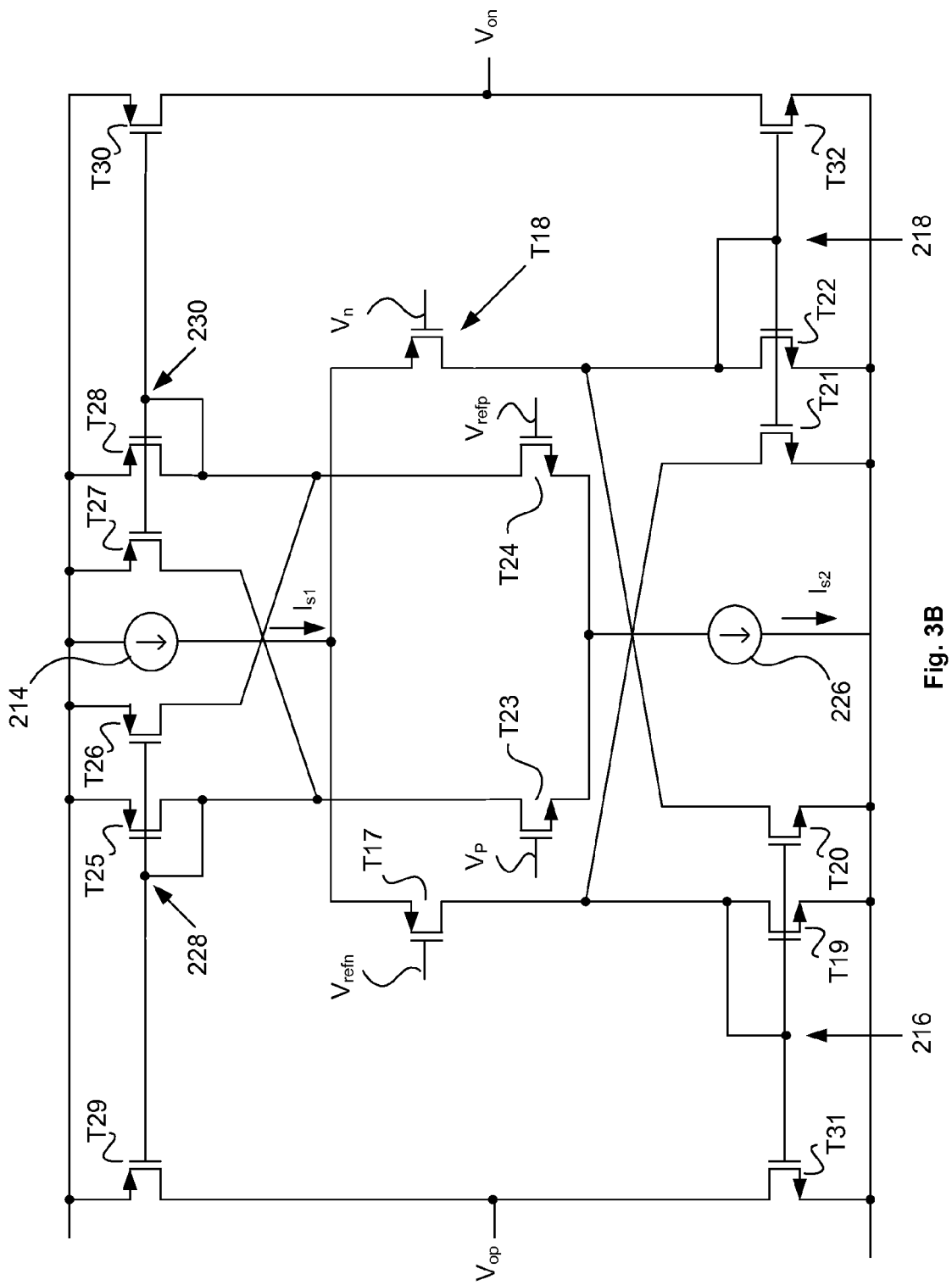
FIG. 3B schematically illustrates in detail the comparators within the circuit of FIG. 3A.

Comparator 100 can be used in many different types of electrical circuits. In one exemplary implementation, the comparator can be used as part of an over-current detection and protection circuit 200 (see FIG. 3A). Circuit 200 may be included in a power management system, for example. Circuit 200 includes a comparator 201 comprising an input terminal for receiving an input current Iin, and a pair of output terminals 202, 203 for providing differential output signals Vp, Vn, respectively. Signal Vp and a reference voltage Vrefp are applied to input terminals of a comparator 206. Similarly, voltages Vn and Vrefn are applied to input terminals of a comparator 209. It is to be understood that comparators 206 and 209 may be a single differential comparator as illustrated in FIG. 3B, which may have four (4) inputs comprising two input signals (e.g., Vp and Vn) and two reference voltages (e.g., Vrefp and Vrefn). Such a comparator is illustrated in greater detail in FIG. 3B.

Referring to FIG. 3B, comparator 206 comprises an input terminal for receiving input voltage Vrefn, a second input terminal for receiving input signal Vn, a current source 214 for passing a current IS1, P channel transistors T17 and T18, N channel transistors T19, T20, T21 and T22, and output leads 216 and 218. The first comparator is the same as comparator 100 of FIG. 2.

Second comparator 209 comprises an input terminal for receiving input signal Vp, a second input terminal for receiving input reference voltage Vrefp, a current source 226 for passing a current IS2, N channel transistors T23 and T24, P channel transistors T25, T26, T27 and T28, and output leads 228 and 230. The first and second comparators of FIG. 3B are essentially identical, except that the transistor types are reversed.

Output leads 228 and 230 drive the gates of P channel transistors T29 and T30, respectively. Output leads 216 and 218 drive the gates of N channel transistors T31 and T32 respectively. Transistors T29 and T31 act as an inverter providing an output signal Vop, while transistors T30 and T32 act as an inverter providing an output signal Von.

Figure 3C:
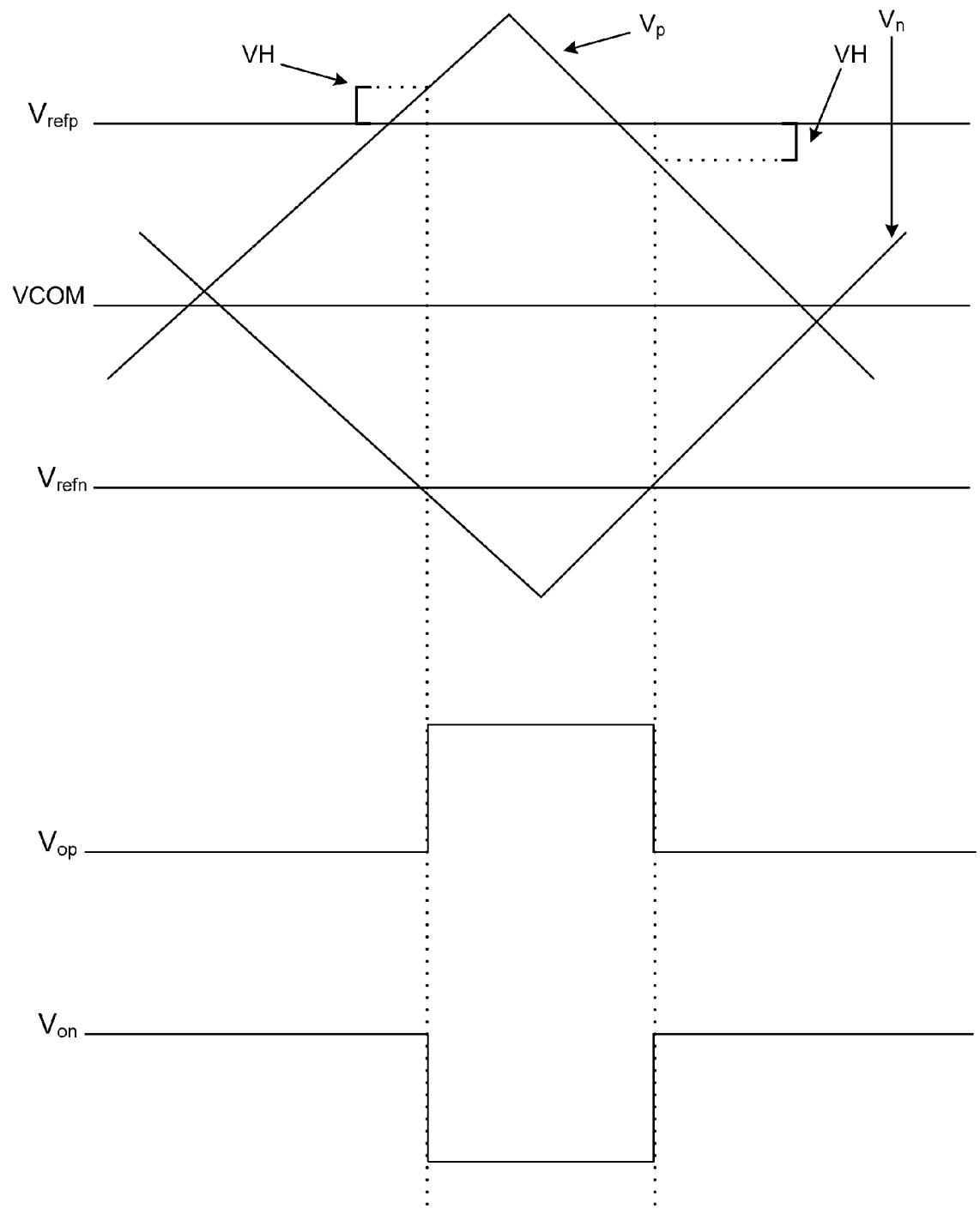
FIG. 3C illustrates signal waveforms associated with the circuit of FIGS. 3A and 3B.

FIG. 3C is a waveform diagram illustrating signals Vp, Vrefp, Vn and Vrefn. In one exemplary embodiment, voltages Vrefp equals 2.125 volts, voltage Vrefn equals 0.875 volts, VSS is zero volts and VDD is 3 volts. However, these values are merely examples, and other voltages can also be used. As current Iin rises, voltage Vp rises above voltage Vrefp and voltage Vn falls below Vrefn. Voltages Vp and Vn are as follows:

$$Vp=VCM+K(Iin) \qquad \text{(Equation 9)}$$

$$Vn=VCM-K(Iin) \qquad \text{(Equation 10)}$$

where VCM is the common mode voltage present at output leads 202 and 203 and K is the gain of circuit. Unfortunately, VCM varies (in some circumstances by as much as 31 millivolts), and this is undesirable. In order to make circuit 200 more stable, comparators 206 and 207 exhibit a hysteresis voltage VH between 50 and 100 millivolts. Again, these values are merely exemplary. Because of the hysteresis, voltage Vop only goes high when voltage Vp exceeds Vrefp by VH, voltage Vop only goes low when voltage Vp falls below Vrefp by VH, voltage Von only goes low when voltage Vn falls below Vrefn by VH, and voltage Von only goes high when voltage Vn rises above voltage Vrefn by VH.

It will be appreciated that comparator circuits 206 and 209 in FIG. 3B compare voltage Vp to Vrefp and Vn to Vrefn. This dual comparison helps eliminate the effect of the VCM.

In the implementation described above, comparators 206 and 209 exhibit the same amount of hysteresis VH, both in the rising and falling directions. However, in other implementations, comparators 206 and 209 can exhibit different amounts of hysteresis from each other, and different amounts of hysteresis in the rising and falling directions. This is accomplished by altering the ratio of widths to lengths of appropriate ones of transistors T19-T22 for comparator 209, or appropriate ones of transistors T25-T28 for comparator 206. In yet other implementations, comparators 206 and 209 can exhibit hysteresis in only one direction (e.g., rising but not falling, or falling but not rising). This is accomplished by eliminating an appropriate one of transistors T26 or T27 for comparator 206, or an appropriate one of transistors T20 or T21 for comparator 209.

Circuit 200 uses a pair of P channel transistors T17, T18 to compare voltage Vrefn and Vn, and N channel transistors to compare voltages Vrefp and Vp. Depending upon the voltages being compared, this helps maintain the linearity of circuit 200. However, as described below, in other embodiments, one can use two pairs of N channel transistors or two pairs of P channel transistors for the differential pairs.

Figure 4:
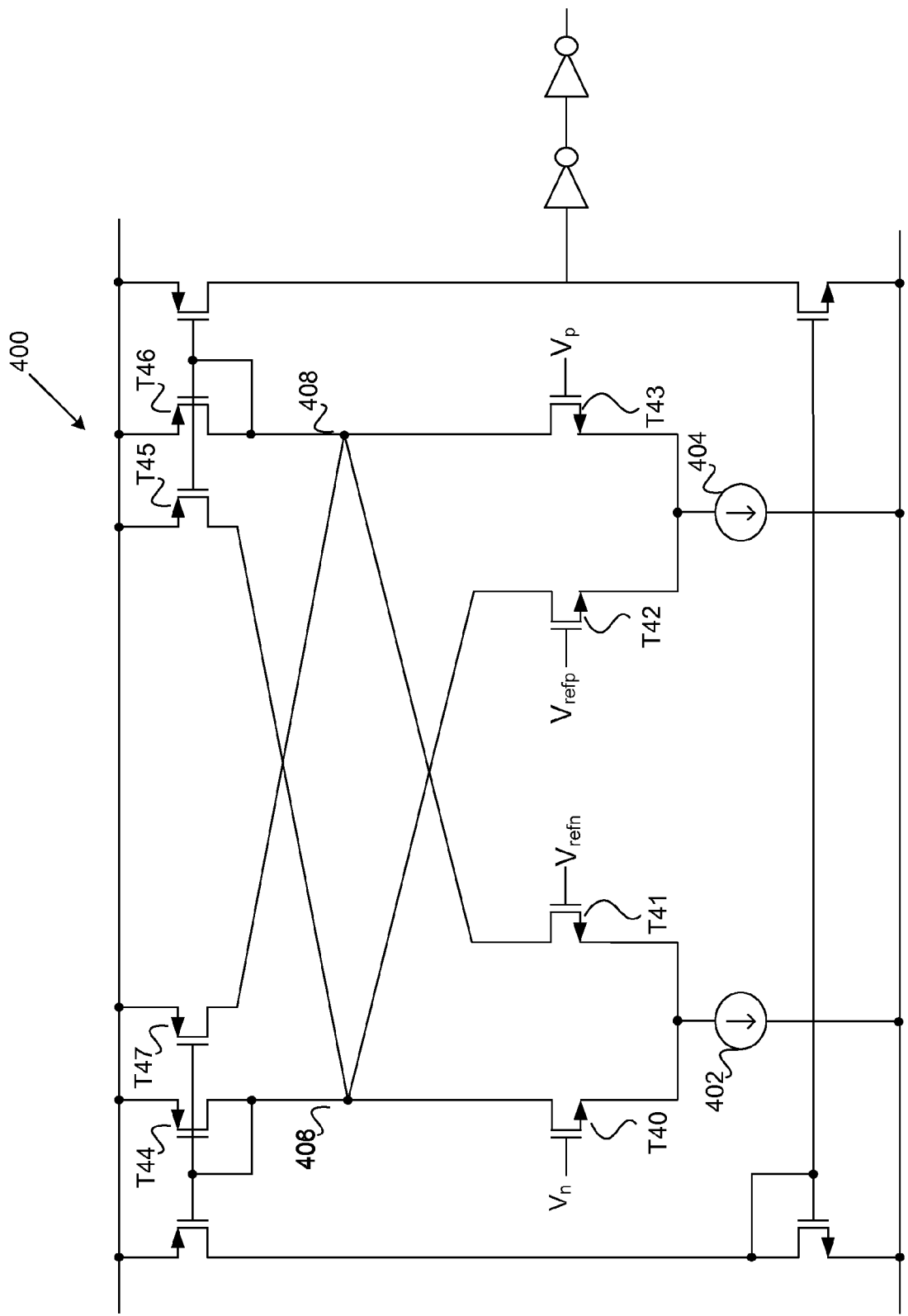
FIG. 4 schematically illustrates one implementation of a pair of comparators.

FIG. 4 illustrates a circuit 400 comprising a pair of comparators constructed in accordance with another implementation of the invention. One main difference between the circuit of FIGS. 3B and 4 is that instead of providing one pair of differentially coupled N channel transistors T23 and T24 and one pair of differentially coupled P channel transistors T17 and T18, circuit 400 comprises a pair of N channel transistors T40, T41 for comparing signal Vn and signal Vrefn and a second pair of N channel transistors T42, T43 for comparing signal Vp and Signal Vrefp. The drain of transistor T40 is coupled to the drain of P channel transistors T44 and T45. The drain of transistor T41 is coupled to the drain of P channel transistors T46 and T47. The drain of transistor T42 is coupled to the drain of P channel transistors T44 and T45. The drain of transistor T43 is coupled to the drain of P channel transistors T47 and T46.

The sources of transistors T40 and T41 are coupled to a current source 402, while the sources of transistors T42 and T43 are coupled to a current source 404.

The voltage at node 406 drives the gates of transistors T44 and T47, while the voltage at node 408 drives the gates of transistors T45 and T46.

While the invention has been described with respect to different implementations, various modifications can be made in form and detail without departing from the scope of the invention. For example, the transistor types shown in the drawings can be switched (e.g., from P channel to N channel and vice versa). Similarly, other components can be added to circuits described above. The comparator can be used to compare two data signals, two reference voltages, combinations of signals and voltages, etc. Accordingly, all such changes are within the scope of the present invention.

What is claimed is:

1. An apparatus comprising:
   a first circuit configured to compare a first input voltage with a second input voltage, wherein the first circuit outputs a first output voltage at a first output and a second output voltage at a second output based on the comparison of the first input voltage and the second input voltage; and
   a second circuit configured to compare a third input voltage with a fourth input voltage, wherein the second circuit outputs a third output voltage at a third output and a fourth output voltage at a fourth output based on the comparison of the third input voltage and the fourth input voltage,
   wherein the first circuit is configured to draw a first portion of current from the second output or draw a second portion of current from the first output to cause the first circuit to exhibit a first hysteresis, and
   wherein the second circuit is configured to draw a third portion of current from the fourth output or draw a fourth portion of current from the third output to cause the second circuit to exhibit a second hysteresis, and
   wherein a total amount of hysteresis in the first hysteresis and second hysteresis is configurable based on a ratio between transistor widths in the first circuit and second circuit.

2. The apparatus of claim 1, further comprising a third circuit configured to receive an input current and output the first input voltage to the first circuit and the third input voltage to the second circuit.

3. The apparatus of claim 2, wherein:
   the second input voltage comprises a first reference voltage; and
   the fourth input voltage comprises a second reference voltage.

4. The apparatus of claim 1, wherein:
   the first circuit comprises a first comparator; and
   the second circuit comprises a second comparator.

5. The apparatus of claim 1, wherein the first circuit and the second circuit comprise a single differential comparator.

6. The apparatus of claim 1, wherein first input voltage and the third input voltage comprise a common mode voltage, wherein the first hysteresis exhibited by the first circuit and the second hysteresis exhibited by the second circuit are both greater than a variance of the common mode voltage.

7. The apparatus of claim 1, wherein first hysteresis is a same amount as the second hysteresis.

8. The apparatus of claim 1, wherein first hysteresis is a different amount from the second hysteresis.

9. The apparatus of claim 1, wherein first hysteresis or the second hysteresis exhibit a different amount of hysteresis in a rising direction and a falling direction.

10. The apparatus of claim 1, wherein an amount of hysteresis of the first hysteresis or the second hysteresis is varied by varying a respective width of a transistor in the first circuit or the second circuit.

11. The apparatus of claim 1, wherein the first hysteresis and the second hysteresis are provided without a resistor divider network.

12. The apparatus of claim 1, wherein the first hysteresis and the second hysteresis are provided without varying the first input voltage or the third input voltage.

13. The apparatus of claim 1, wherein the first circuit and the second circuit are used in an over-current detection circuit.

14. A method comprising:
   comparing, with a first circuit, a first input voltage with a second input voltage;
   outputting a first output voltage at a first output and a second output voltage at a second output based on the comparison of the first input voltage and the second input voltage;
   comparing, with a second circuit, a third input voltage with a fourth input voltage;
   outputting a third output voltage at a third output and a fourth output voltage at a fourth output based on the comparison of the third input voltage and the fourth input voltage;
   drawing a first portion of current from the second output or drawing a second portion of current from the first output to cause the first circuit to exhibit a first hysteresis; and
   drawing a third portion of current from the fourth output or drawing a fourth portion of current from the third output to cause the second circuit to exhibit a second hysteresis, and
   wherein a total amount of hysteresis in the first hysteresis and second hysteresis is configurable based on a ratio between transistor widths in the first circuit and second circuit.

15. The method of claim 14, further comprising:
   receiving an input current;
   outputting the first input voltage to the first circuit; and
   outputting the third input voltage to the second circuit.

16. The method of claim 14, wherein first input voltage and the third input voltage comprise a common mode voltage, wherein the first hysteresis exhibited by the first circuit and the second hysteresis exhibited by the second circuit are both greater than a variance of the common mode voltage.

17. The method of claim 14, wherein the first hysteresis or the second hysteresis is varied by varying a respective width of a transistor in the first circuit or the second circuit.

18. The method of claim 14, wherein first hysteresis or the second hysteresis exhibit a different amount of hysteresis in a rising direction and a falling direction.

19. The method of claim 14, wherein the first hysteresis and the second hysteresis are provided without a resistor divider network.

20. The method of claim 14, wherein the first hysteresis and the second hysteresis are provided without varying the first input voltage or the third input voltage.

* * * * *